United States Patent [19]

Bashir

[11] Patent Number: 5,572,465

[45] Date of Patent: Nov. 5, 1996

[54] POWER SUPPLY CONFIGURED SENSING SCHEME FOR FLASH EEPROM

[75] Inventor: Amir Bashir, Folsom, Calif.

[73] Assignee: Intel Corporation, Santa Clara, Calif.

[21] Appl. No.: 451,037

[22] Filed: May 25, 1995

[51] Int. Cl.$^6$ .................................................. G11C 11/34
[52] U.S. Cl. .................................. 365/185.21; 365/207
[58] Field of Search ........................... 365/185.2, 185.21, 365/185.18, 185.33, 207

[56] References Cited

U.S. PATENT DOCUMENTS

| | | | |
|---|---|---|---|
| 5,243,573 | 9/1993 | Makihara | 365/185.21 |
| 5,245,574 | 9/1993 | Fray | 365/185.18 |
| 5,444,656 | 8/1995 | Bauer | 365/185.2 |

*Primary Examiner*—A. Zarabian
*Attorney, Agent, or Firm*—Blakely, Sokoloff, Taylor & Zafman

[57] ABSTRACT

Bias selector circuitry for a memory cell sensing circuit is described. The bias selector circuitry includes a reference voltage generator, an output node, and a selector. The output node provides the bias voltage to the reference bitline load and the sense bitline load for controlling the reference and sense bitline node voltages, respectively. The selector provides a first bias voltage to the output node if a power supply voltage is at a first level. The selector selects the reference voltage generator to provide a second bias voltage to the output node if the power supply voltage is at a second level. The reference bitline node voltage is maintained at approximately the midpoint of the operating range of the sense bitline node voltage.

17 Claims, 3 Drawing Sheets

POWER SUPPLY CONFIGURED SENSING SCHEME FOR FLASH EEPROM

FIELD OF THE INVENTION

This invention pertains to the field of memory circuitry. In particular this invention pertains to providing a FLASH memory circuitry sense amplifier reference voltage over a range of power supply levels.

BACKGROUND OF THE INVENTION

Memory circuitry typically uses sense amplifiers to determine the state of a selected memory cell during a read operation. The memory cell is selectively coupled to a sense bitline. The sense amplifiers typically compare a sensed voltage at a node of the sense bitline with a reference voltage in order to determine the state of the selected memory cell. Varying the reference voltage changes the threshold at which the sense amplifier determines whether the memory cell is storing a one or a zero. Thus the accuracy of the read operation is dependent upon the reference voltage supplied to the sense amplifier.

Floating gate electrically erasable programmable read only memory (FLASH EEPROM) is one example of a type of memory that utilizes sense amplifiers to detect the state of memory cells. A FLASH memory cell is erased when the net charge on the floating gate is neutral. An erased FLASH memory cell is referred to as storing a logical "1". A FLASH memory cell is programmed when the net charge on the floating gate is negative. A programmed FLASH memory cell is referred to as storing a logical "0".

FIG. 1 illustrates typical prior art circuitry for sensing the state of a selected FLASH memory cell. A sense bitline provides a path for sinking current through the selected FLASH memory cell. A reference bitline provides a path for sinking current through a reference FLASH memory cell. A programmed FLASH cell sinks a negligible amount of current, so the reference cell is not programmed. The resulting reference voltage on the reference bitline is compared to a sensed voltage on the sense bitline. The state of the sensed FLASH memory cell is thus compared against the state of the reference FLASH memory cell.

The reference voltage for the sense amplifier is generally derived from Vcc which represents the magnitude of the power supply voltage for the memory circuitry. This reference voltage is generally established at the midpoint of the expected operating range of the memory circuitry to ensure speed, accuracy, and symmetry. Any variation in the power supply voltage will affect the reference voltage for the sense amplifier.

As more standards for computer system power supplies evolve, the memory circuitry is expected to perform over multiple ranges of power supplies. Currently 3.3 volt and 5 volt power supply systems are prevalent in the microprocessor industry. The memory circuitry should maintain the same level of performance regardless of whether a 3.3 volt or a 5 volt power supply is used. Ideally the memory circuitry should maintain the same level of performance over a range of power supply levels in order to account for nominal differences in the level of the power supply voltages as well as tolerance factors. Allowing for a 10% tolerance factor this indicates that the memory circuitry should maintain the same level of performance over a power supply range of approximately 3.0 to 5.5 volts.

Due to the nonlinearities of transistors 110 and 120 in FIG. 1, however, there is a nonlinear relationship between power supply levels and the reference voltage. Increases in Vcc tend to result in disproportionate increases in the reference voltage. In other words, doubling Vcc will not similarly double the reference voltage. The sense amplifier performance tends to degrade if the reference voltage is not at the midpoint of the operating range of the sense bitline voltage.

One disadvantage of the prior art biasing circuitry is that if the memory circuitry is optimized to work at a given power supply level such as 3.3 volts, the memory circuitry may not operate accurately or with the same level of performance at another voltage level such as 5 volts.

SUMMARY OF THE INVENTION

Bias selector circuitry for a memory cell sensing circuit is described. The bias selector circuitry includes a reference voltage generator, an output node, and a selector. The output node provides the bias voltage to the reference bitline load and the sense bitline load for controlling the reference and sense bitline node voltages, respectively. The selector provides a first bias voltage to the output node if a power supply voltage is at a first level. The selector selects the reference voltage generator to provide a second bias voltage to the output node if the power supply voltage is at a second level. The reference bitline node voltage is maintained at approximately the midpoint of the operating range of the sense bitline node voltage.

Other features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
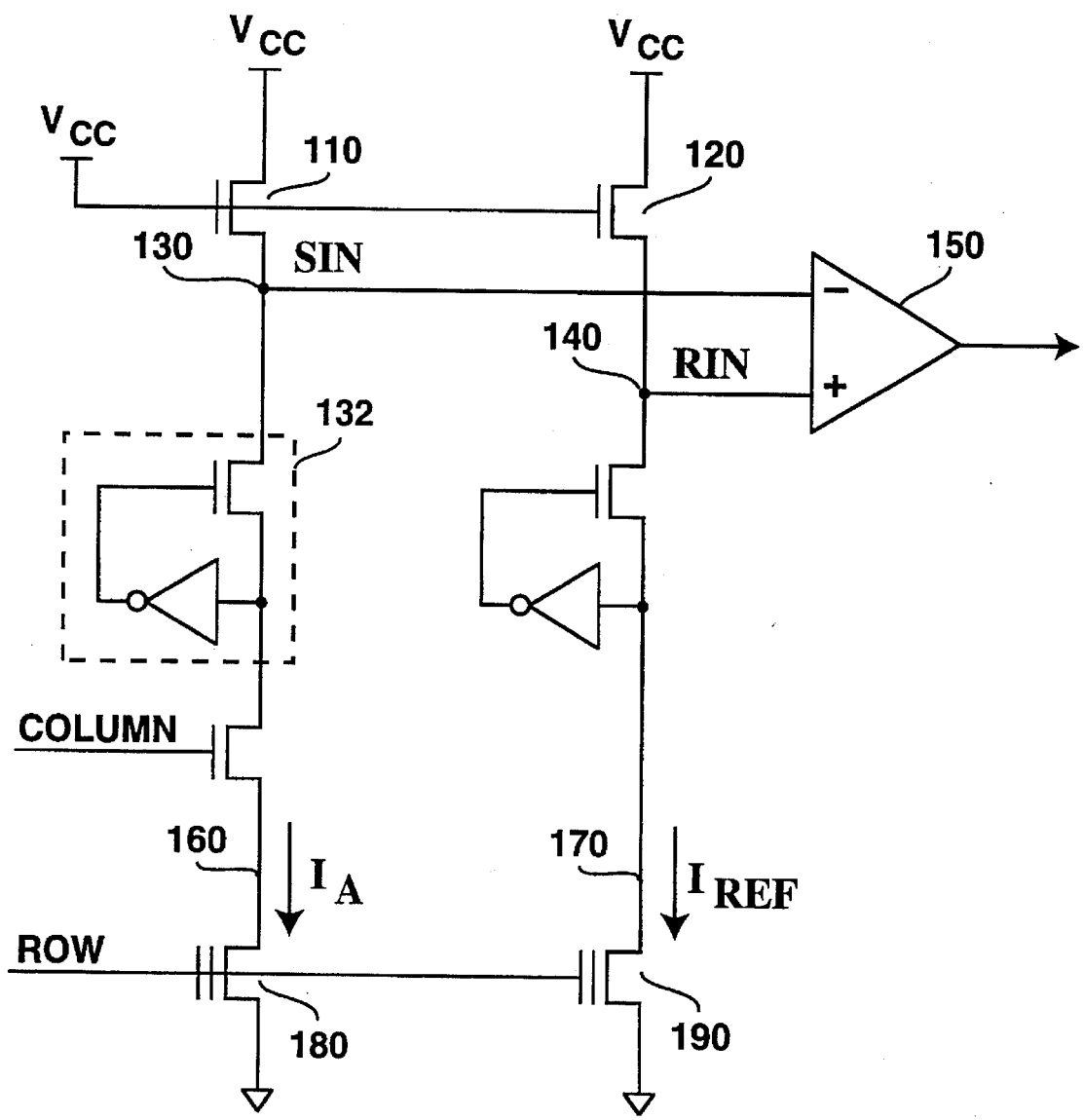
FIG. 1 illustrates a prior art memory state sensing scheme.

FIG. 1 illustrates a prior art FLASH memory cell sensing circuit. Sense bitline 160 is coupled to selected FLASH memory cell 180. Reference bitline 170 is coupled to reference FLASH memory cell 190. The sense current passing through sense bitline 160 will vary depending upon whether the selected memory cell being sensed is storing a charge or not. The reference bitline 170 is coupled to a reference FLASH memory cell that is not storing a charge.

Sense amplifier 150 determines the state of the selected memory cell by comparing a sense bitline voltage to a reference bitline voltage. A first input to the sense amplifier is provided at node 130 (SIN) on the sense bitline. A second input to the sense amplifier is provided at node 140 (RIN) on the reference bitline. Ideally the reference bitline is biased so that for a given reference current, $I_{ref}$, node RIN will be at the midpoint of the voltage range over which node SIN is expected to operate. This helps to ensure speed, accuracy, and symmetry.

Selected FLASH cell 180 is coupled to node SIN through column bias circuitry 132. The function of this column bias circuitry is to isolate the sense column load (transistor 110) from bitline 160 while supplying a bias voltage to the drain of selected FLASH cell 180.

If the selected memory cell is storing a charge then the voltage at node SIN will exceed RIN due to the reduction in sense bitline current, $I_A$. Alternatively, if the selected memory cell is not storing a charge, then the voltage at node SIN will be lower than RIN because the selected memory cell is coupled to a ground potential. Thus SIN will range from some voltage margin above RIN to some voltage margin below RIN.

The reference bitline current, $I_{ref}$, is set by the reference FLASH cell. Alternatively, in other embodiments, the reference current is set using current mirrors or a constant current device. The voltage drop across the reference column load (transistor 120) sets the reference voltage at node RIN. In the prior art, the voltage applied to the gate of transistor 120 was Vcc. For a given reference current, the parameters of transistor 120 were chosen so that node RIN was biased at Vcc/2 (i.e., the sense amplifier reference voltage) for a particular Vcc such as Vcc=3.3 volts.

The relationship between the drain current ($I_{ref}$) and the gate-to-source voltage of a metal oxide semiconductor field effect transistor (MOSFET) operating in the saturation mode can be approximated by the following equation:

$$I_{ref} = \frac{\beta}{2}(V_{GS} - V_T)^2$$

where:

$\beta$ represents a physical characteristic of the transistor that is fixed at the time of manufacture; $V_T$ is called the threshold or "turn-on" voltage of the transistor; and $V_{GS}$ represents the difference between the gate and source potentials (i.e., $V_G - V_S$). Since the source of transistor 120 is coupled to node RIN, the source potential is $V_{RIN}$. The gate of transistor 120 is coupled to Vcc so that substitution yields:

$$I_{ref} = \frac{\beta}{2}(V_{CC} - V_{RIN} - V_T)^2$$

Solving for $V_{RIN}$ yields:

$$V_{RIN} = V_{CC} - \left( V_T + \sqrt{2\frac{I_{ref}}{\beta}} \right)$$

In order for VRIN to be fixed at Vcc/2, we must have $$V_T + \sqrt{2\frac{I_{ref}}{\beta}} = \frac{V_{CC}}{2}$$

This condition cannot be met for all Vcc because $V_T$ and $\beta$ are substantially fixed at the time of manufacture of the transistor, and $I_{ref}$ is to remain constant. $I_{ref}$ is kept constant between the higher and lower operating voltages by pumping up the wordlines when Vcc is at the lower operating voltage. In one embodiment, when Vcc is at 3.3 volts, 5 volts is applied to the wordlines.

If the biasing circuitry is optimized for a 3.3 volt Vcc, for example, then $$V_T + \sqrt{2\frac{I_{ref}}{\beta}} = \frac{3.3}{2} \approx 1.7 \text{ volts}$$

If a different Vcc is used, such as 5 volts, then $$V_{RIN} = V_{CC} - 1.7 = 5 - 1.7 = 3.3 \text{ volts}$$

In one embodiment, a value of 2.5 volts is desirable for $V_{RIN}$ when Vcc is 5 volts. A $V_{RIN}$ of 3.3 volts is a substantial deviation from the 2.5 volts desired and might cause degradation in the performance of the sense amplifier during read operations. Returning to an earlier equation, we can determine that a value other than Vcc (e.g., 5 volts) can be applied to the gate in order to achieve the desired $V_{RIN}$.

$$V_{RIN} = V_G - \left( V_T + \sqrt{2\frac{I_{ref}}{\beta}} \right) = 2.5 \text{ volts}$$

$$V_{RIN} = V_G - 1.7 = 2.5 \text{ volts}$$

Thus $V_G$ should be approximately 4.2 volts instead of 5 volts when Vcc is 5 volts in order to achieve a $V_{RIN}$ of approximately 2.5 volts.

The $\beta$ for the sense bitline transistor is typically not the same as the $\beta$ for the reference bitline transistor. The $\beta$ for the reference bitline transistor is a factor, m, times the $\beta$ of the sense bitline transistor. The factor m typically ranges from 1.0 to 3.0. This helps to ensure a non-zero potential difference between the reference node and the sense node. Choosing different $\beta$s is well known in the art. In one embodiment, the $\beta$ of the reference bitline load transistor is approximately twice the $\beta$ of the sense bitline load transistor in order to provide adequate swing margins.

Figure 2:
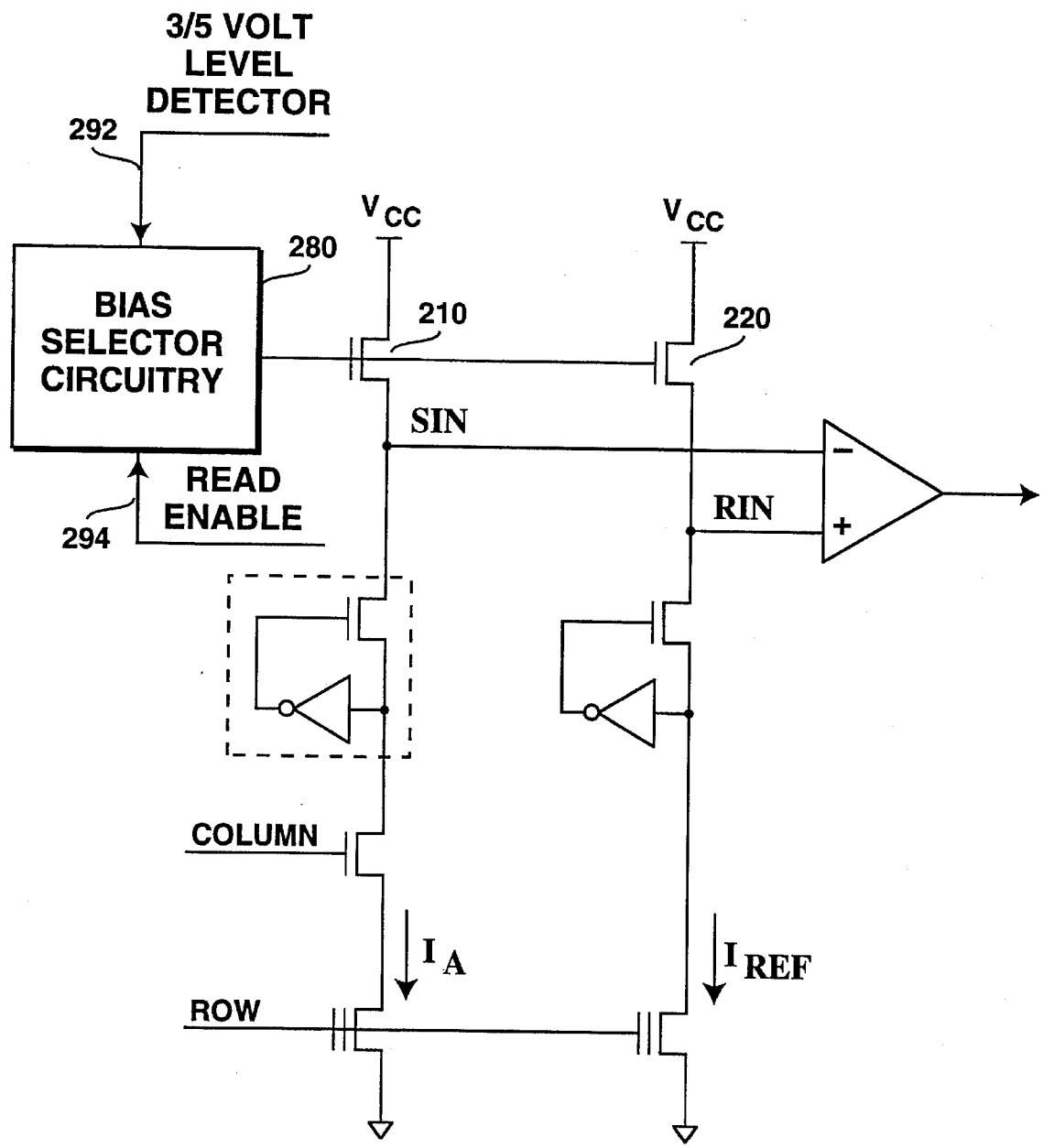
FIG. 2 illustrates a power supply configured sensing scheme.

FIG. 2 illustrates bias selector circuitry for switching the bias voltage applied to the gates of load transistors 110 and 120 depending upon Vcc. The bias selector circuitry effectively configures the FLASH EEPROM sensing circuitry based on the power supply level.

In one embodiment, bias selector circuitry 280 provides Vcc to the gates of load transistors 210 and 220 when Vcc is approximately 3 volts. When Vcc exceeds approximately 4.0 volts, bias selector circuitry 280 uses a reference voltage generator to provide a bias voltage of about 4.2 volts to the gates of transistors 210 and 220.

Many circuits which are designed to operate for multiple power supplies utilize a detector to determine the level of the power supply. Such detectors are well known in the art. Bias selector circuitry 280 uses the output (292) of a 3/5 volt detector to help determine whether to couple Vcc or another bias voltage to the gates of transistors 210 and 220. In this embodiment, read enable signal 294 also serves as an input to the bias selector circuitry for the determination of when a bias voltage other than Vcc should be applied to the gates of 210 and 220.

Figure 3:
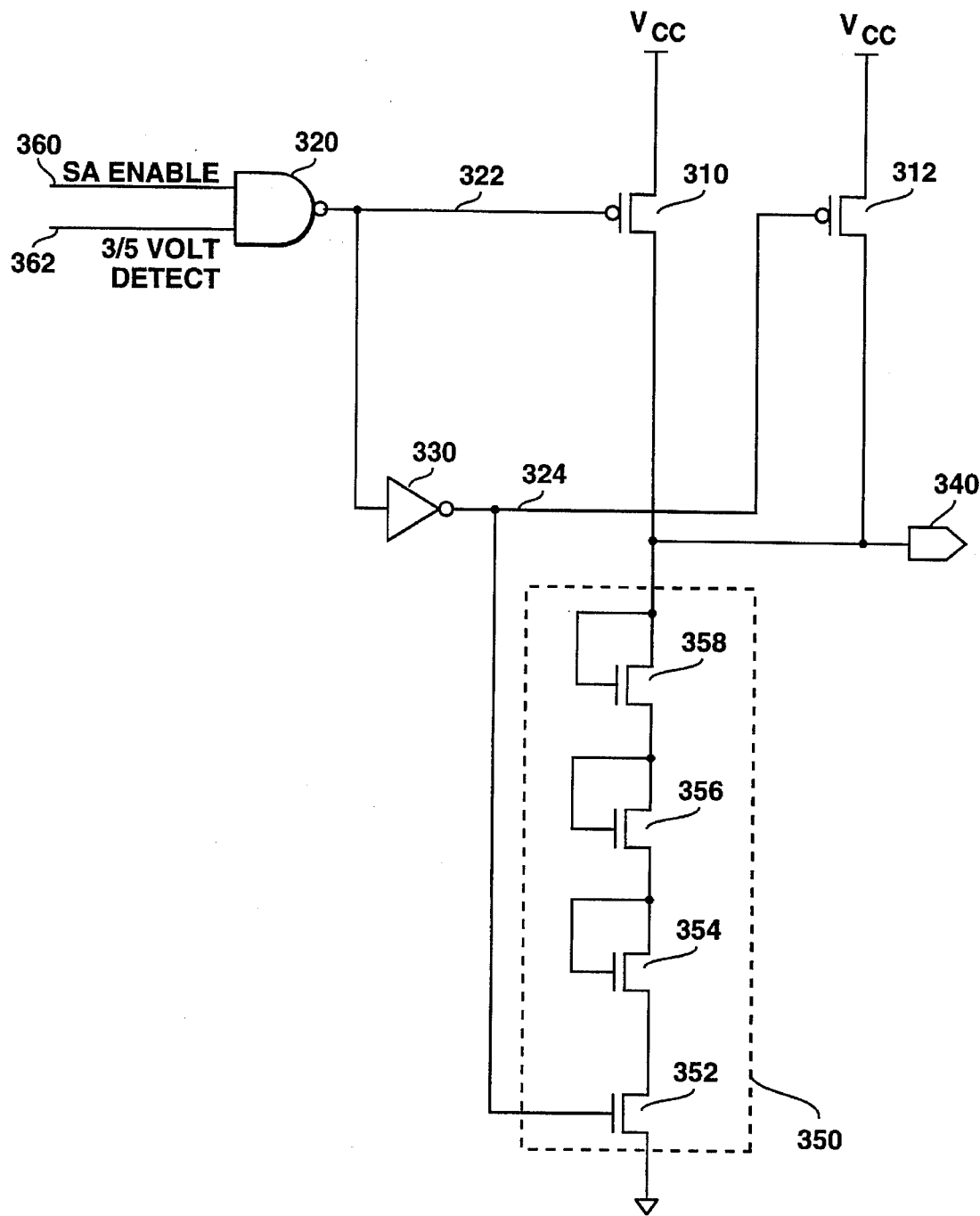
FIG. 3 illustrates an embodiment of the bias selector circuitry.

FIG. 3 illustrates one embodiment of bias selector circuitry 280. Output node 340 is coupled to the gates of transistors 210 and 220 which were illustrated in FIG. 2. PMOS transistor 312 serves as a switch to couple or decouple Vcc to node 340. PMOS transistor 310 serves as a switch to couple or decouple reference voltage generator 351 to output node 340.

The combinatorial logic provided by NAND gate 320 and NOT gate 330 ensures that the signals on 322 and 324 are complementary. This helps to ensure that PMOS transistors 310 and 312 are not both "on" at the same time. In addition, using signal 324 to control N-channel transistor 352 helps to ensure that reference voltage generator 350 and transistor 312 will not be "on" at the same time.

In one embodiment, a low level on 362 indicates that Vcc is less than approximately 4 volts and a high level on 362 indicates that Vcc is greater than or equal to approximately 4 volts. When transistor 352 is "on" the reference voltage generator 350 is said to be on. The following table indicates the state of enabling transistors (switches) 310, 312, the reference voltage generator, and the output voltage at 340 for various combinations of input voltage and read enable signal values.

| Vcc | 3/5 volt detect (362) | Read Enable (360) | Switch 310 | Switch 312 | Ref. Voltage Gen. (351) | Output Node (340) |
|---|---|---|---|---|---|---|
| 3.3 | 0 | 0 | OFF | ON | OFF | ~Vcc |
| 3.3 | 0 | 1 | OFF | ON | OFF | ~Vcc |
| 5 | 1 | 0 | OFF | ON | OFF | ~Vcc |
| 5 | 1 | 1 | ON | OFF | ON | ~4.2 |

When the read enable signal and the 3/5 volt signal are at a logically high value, reference voltage generator 350 and transistor 310 are turned on.

The reference voltage generator includes series-coupled, diode-connected transistors 354, 356, and 358. Transistor 352 serves as a switch to provide a current path from series coupled transistors 354, 356, and 358 to signal ground. When the reference voltage generator is on, the output voltage at node 340 is primarily a function of the threshold voltages of transistors 354, 356, and 358. In other words, the output voltage at node 340 is approximately the sum of the threshold voltages of transistors 354, 356, and 358. The number of series-coupled, diode-connected transistors required for the reference voltage generator depends on Vcc, the required output voltage, and the threshold voltage, $V_T$ of each of the transistors. Other reference voltage generators can be used. For example, in another embodiment, reference voltage generator 350 uses one or more diodes in place of series-coupled, diode-connected MOSFETs. The reference generator designed such that its output voltage is sufficient to bias the reference voltage node on the reference bitline to approximately the midpoint of the operating range of the sense bitline sensing node (230).

The reference voltage generator uses power when in operation. In order to minimize power consumption, the reference voltage generator should be powered up only when needed and should not remain on at all times. In one embodiment, the operation of the reference voltage generator is a function of both the read enable signal and Vcc. In other words, the reference voltage generator is powered up only when Vcc is at the higher voltage level and the read enable signal is asserted. This ensures that the reference voltage generator is only turned on when a read operation is to be performed and the available power supply is at the higher Vcc level. In FIG. 3, the combinatorial logic provides a signal to turn the reference voltage generator on using transistor 352. The reference voltage generator is turned on only when Vcc is at the higher voltage level and the read enable signal is asserted.

In the preceding detailed description, the invention is described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. Bias selector circuitry for a memory cell sensing circuit, comprising:
   a reference voltage generator;
   a selector for providing a bias voltage to both a reference bitline load for controlling a reference bitline node voltage and a sense bitline load for controlling a sense bitline node voltage;
   wherein the selector provides a first bias voltage to the reference and sense bitline loads if a power supply voltage is at a first level, wherein the selector selects the reference voltage generator to provide a second bias voltage to the reference and sense bitline loads if the power supply voltage is at a second level, wherein the reference bitline node voltage is maintained at approximately a midpoint of an operating range of the sense bitline node voltage.

2. The bias selector circuitry of claim 1, wherein when the memory cell is a FLASH EEPROM memory cell.

3. The bias selector circuitry of claim 1 wherein the reference voltage generator comprises a plurality of series-coupled, diode-connected field effect transistors of a first-type.

4. The bias selector circuitry of claim 1 wherein the reference voltage generator is powered up only when a sense operation is performed.

5. The bias selector circuitry of claim 1, wherein the first level corresponds to power supply voltages less than approximately 4 volts, wherein the second level corresponds to power supply voltages greater than or equal to approximately 4 volts.

6. The bias selector circuitry of claim 5, wherein when the power supply voltage is at the first level the selector is coupled to provide the power supply voltage as the first bias voltage.

7. The bias selector circuitry of claim 6 wherein the selector further comprises
   logic circuitry coupled to a power supply voltage level detector, the logic circuitry providing a first signal and a second signal responsive to a level of the power supply voltage, the second signal complementary to the first signal;
   a first enabling transistor for coupling the power supply voltage to the reference and sense bitline loads in response to the first signal; and
   a second enabling transistor for coupling the reference voltage generator to the reference and sense bitline loads in response to the second signal.

8. The selector of claim 7 wherein:
   the first enabling transistor is a field effect transistor having a gate coupled to receive the first signal; and
   the second enabling transistor is a field effect transistor having a gate coupled to receive the second signal.

9. The logic circuitry of claim 7 further comprising:
   a NAND gate, the NAND gate coupled to receive a signal from the power supply voltage detector and a read enable signal, an output of the NAND gate coupled to the gate of the first enabling transistor; and
   a NOT gate coupled to receive an output of the NAND gate, an output of the NOT gate coupled to the gate of the second enabling transistor.

10. Memory cell sensing circuitry comprising:
    a reference bitline load for controlling a reference current through a reference bitline;
    a sense bitline load for controlling a sense current through a sense bitline, the sense bitline coupled to a selected memory cell;
    a sense amplifier having a first input coupled to the reference bitline and a second input coupled to the sense bitline;
    a bias voltage selector, wherein the bias voltage selector provides a first bias voltage to the reference bitline and sense bitline loads if a power supply voltage is at a first level, wherein the bias voltage selector provides a second bias voltage to the reference bitline and sense bitline loads if the power supply voltage is at a second level, wherein a reference bitline node voltage is maintained at approximately a midpoint of an operating range of a sense bitline node voltage.

11. The memory cell sensing circuitry of claim 10 wherein the bias voltage selector further comprises:

a reference voltage generator providing the first bias voltage;

a selector coupled to receive the first bias voltage from the reference voltage generator, the selector responsive to a level of the power supply for providing one of the first and second bias voltages to the reference and sense bitline loads.

12. The memory cell sensing circuitry of claim 11 wherein the selected memory cell is a FLASH EEPROM memory cell.

13. The bias voltage selector of claim 11 wherein the reference voltage generator comprises a plurality of series-coupled, diode-connected field effect transistors of a first-type.

14. The bias voltage selector of claim 11 wherein the reference voltage generator is powered up only when a sense operation is performed.

15. The bias voltage selector of claim 11, wherein the first level corresponds to power supply voltages less than approximately 4 volts, wherein the second level corresponds to power supply voltages greater than or equal to approximately 4 volts.

16. The bias voltage selector of claim 15, wherein when the power supply voltage is at a first level the selector couples the power supply voltage to the output node to provide the first bias voltage.

17. A method of controlling a reference voltage for memory sensing circuitry, comprising the steps of:

detecting a level of a power supply voltage;

applying a first bias voltage to a reference bitline load and to a sense bitline load during a read operation if the power supply voltage is at a first level;

applying a second bias voltage to the reference and sense bitline loads during the read operation when the power supply voltage is at a second level.

* * * * *

UNITED STATES PATENT AND TRADEMARK OFFICE
CERTIFICATE OF CORRECTION

PATENT NO. : 5,572,465
DATED : November 5, 1996
INVENTOR(S) : Amir Bashir

It is certified that error appears in the above-identified patent and that said Letters Patent is hereby corrected as shown below:

In column 3 at line 47 delete "VRIN" and insert --$V_{RIN}$--

Signed and Sealed this

Fourth Day of March, 1997

Attest:

BRUCE LEHMAN

Attesting Officer

Commissioner of Patents and Trademarks